United States Patent
Han et al.

(10) Patent No.: US 10,401,677 B2
(45) Date of Patent: Sep. 3, 2019

(54) OPTICAL UNIT AND DISPLAY DEVICE HAVING THE SAME

(71) Applicant: LG Display Co., Ltd., Seoul (KR)

(72) Inventors: Ji-Su Han, Jeonju-si (KR); Dae-Heung Lee, Paju-si (KR); Hye-Jeong Park, Jeonju-si (KR)

(73) Assignee: LG Display Co., Ltd., Seoul (KR)

( * ) Notice: Subject to any disclaimer, the term of this patent is extended or adjusted under 35 U.S.C. 154(b) by 106 days.

(21) Appl. No.: 15/825,755

(22) Filed: Nov. 29, 2017

(65) Prior Publication Data

US 2018/0149915 A1 May 31, 2018

(30) Foreign Application Priority Data

Nov. 30, 2016 (KR) .................. 10-2016-0162388

(51) Int. Cl.
*H01L 27/32* (2006.01)
*G02F 1/1335* (2006.01)
*H01L 51/52* (2006.01)

(52) U.S. Cl.
CPC .. *G02F 1/133528* (2013.01); *G02F 1/133509* (2013.01); *G02F 1/133514* (2013.01); *G02F 1/133603* (2013.01); *H01L 27/32* (2013.01); *H01L 27/322* (2013.01); *H01L 51/5281* (2013.01); *G02F 2202/046* (2013.01)

(58) Field of Classification Search
CPC ......... G02F 1/133528; G02F 1/133509; G02F 1/133514; G02F 1/133603; G02F 2202/046; H01L 27/32; H01L 27/322; H01L 51/5281
USPC ....................................... 428/411.1
See application file for complete search history.

(56) References Cited

U.S. PATENT DOCUMENTS

2014/0320853 A1* 10/2014 Yeon .............. G01N 21/88
356/237.2

FOREIGN PATENT DOCUMENTS

KR 10-2013-0066451 A 6/2013

\* cited by examiner

*Primary Examiner* — William K Cheung
(74) *Attorney, Agent, or Firm* — Morgan, Lewis & Bockius LLP

(57) ABSTRACT

The present disclosure relates to a display device including a display panel on which an image is displayed, a polarizer disposed on the display panel, a lower fluorescent filter disposed on the polarizer, and an upper fluorescent filter disposed on the lower fluorescent filter. The present disclosure may improve visibility when an image is displayed on the display device and light of a laser pointer in a visible light region is emitted thereto by absorbing the light using the upper and lower fluorescent filters, converting the light into light in a long wavelength band, which is a higher wavelength band than that of the absorbed light, and emitting the light in the long wavelength band.

16 Claims, 6 Drawing Sheets

FIG. 3
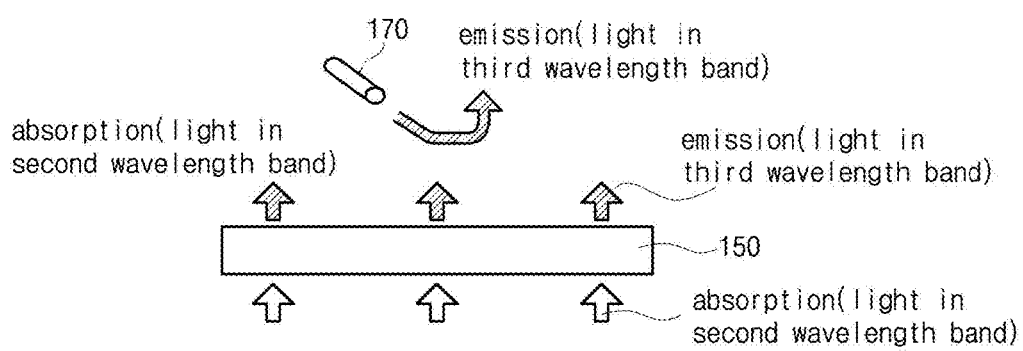
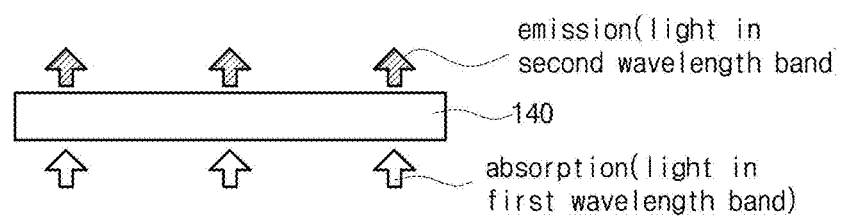
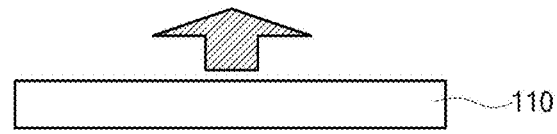

OPTICAL UNIT AND DISPLAY DEVICE HAVING THE SAME

CROSS-REFERENCE TO RELATED APPLICATIONS

This application claims the benefit under 35 U.S.C. § 119(a) of Korean Patent Application No. 10-2016-0162388, filed on Nov. 30, 2016, in the Korean Intellectual Property Office, which is incorporated herein by reference in its entirety.

BACKGROUND

1. Technical Field

The present disclosure relates to a display device, and more particularly, to an optical unit capable of improving visibility when light within a visible light region of a laser pointer is emitted after an image is displayed, and a display device.

2. Discussion of the Related Art

In today's information society, the importance of a display as a visual information transmission medium has been further emphasized, and the display should meet the requirements of low power consumption, thinness, light weight, and high image quality to take a major position in the future.

The display is classified into a luminescent type display which emits light, such as a cathode ray tube (CRT) display, an electro luminescence (EL) display, a light emitting diode (LED) display, a vacuum fluorescent display (VFD), a field emission display (FED), a plasma display panel (PDP), and a non-luminescent type display which cannot emit light, such as a liquid crystal display (LCD).

Among the above displays, the LCD, which displays an image by utilizing optical anisotropy of a liquid crystal, has been in the spotlight as a next generation display device because of the fact that it has superior visibility and a lower average power consumption and amount of heat radiation than that of a conventional CRT having the same sized screen as the LCD.

The LCD according to a related art will be described with reference to FIG. 1.

FIG. 1 is a schematic view illustrating the LCD according to the related art.

As illustrated in FIG. 1, the LCD according to the related art includes a liquid crystal panel 10, an upper polarizer 20 provided on the liquid crystal panel 10, a lower polarizer 30 provided below the liquid crystal panel 10, and a backlight unit (not shown) configured to supply light to the lower polarizer 30.

Here, the liquid crystal panel 10 is formed with a color filter substrate, a thin film transistor array substrate facing the color filter substrate, and a liquid crystal layer formed between the two substrates.

In the LCD, a gradation displayed on a liquid crystal display panel is defined by an electric field applied to the liquid crystal layer, and is displayed from a black gradation to a white gradation according to a magnitude of the electric field applied to the liquid crystal layer. For example, when the magnitude of the applied electric field is large, the white gradation is displayed and an entire LCD screen is bright, but when the magnitude of the electric field applied to the liquid crystal is small, the black gradation is displayed and the screen of the liquid crystal panel is dark, and thus the gradation may be displayed from the black gradation to the white gradation.

Each of the upper polarizer 20 and the lower polarizer 30 has a polarizing axis, and an upper polarizing axis of the upper polarizer 20 is perpendicular to a lower polarizing axis of the lower polarizer 30.

The upper and lower polarizers 20 and 30 polarize incident light into light having light components in directions parallel thereto.

The lower polarizer 30 of the conventional LCD polarizes light incident from the backlight unit (not shown), and the liquid crystal panel 10 is supplied with the light polarized by the lower polarizer 30.

In addition, after the polarized light is supplied to the liquid crystal panel 10, a component of the polarized light is changed by the liquid crystal layer (not shown) and supplied to the upper polarizer 20. The upper polarizer 20 polarizes the light incident from the liquid crystal panel 10 and emits the light.

When the LCD including the above-described configuration according to the related art is driven and light of a laser pointer is emitted toward a screen of the LCD, most of the light is transmitted or absorbed, and thus visibility is reduced. In addition, there is a disadvantage in that most of some reflected light is also specularly reflected, and visibility is reduced in all directions.

In addition, distortion of a display driving time (color) occurs. However, in a case in which a fluorescent film configured to react to visible light is used to secure laser visibility, visibility of a laser emitted from the outside may be improved, but a Stokes-shifted image displayed on the LCD is caused such that visual (color) distortion occurs.

Particularly, in a case in which a near ultra violet (UV) laser pointer is used and a near UV light having a wavelength of 405 nm, which is short wavelength visible light having high energy, is directly or indirectly exposed to a user, there is a possibility of retinal damage being induced.

SUMMARY

Accordingly, embodiments of the present disclosure are directed to an optical unit and a display device that substantially obviate one or more of the problems due to limitations and disadvantages of the related art.

An aspect of the present disclosure is to provide an optical unit capable of improving visibility when an image is displayed on a display and light in a visible light region of a laser pointer is emitted thereto, and a display device having the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an optical unit disposed on a polarizer comprises a first fluorescent filter disposed on the polarizer and a second fluorescent filter disposed on the first fluorescent filter.

The first fluorescent filter may absorb light in a first wavelength band and convert the light into light in a second wavelength band.

The second fluorescent filter may absorb light in a second wavelength band emitted from the first fluorescent filter, convert the light into light in a third wavelength band, and emit the light in the third wavelength band.

Light in a first wavelength band may have a wavelength in a range of 550 to 580 nm, and light in a second wavelength band may have a wavelength in a range of 580 to 620 nm.

Light in a third wavelength band may have a wavelength in a range of 630 to 680 nm.

An emission wavelength of the first fluorescent filter may match an absorption wavelength of the second fluorescent filter.

In addition, the second fluorescent filter may absorb light in a second wavelength band emitted from a laser pointer, convert the light into light in a third wavelength band, and emit the light in the third wavelength band.

A material of the first fluorescent filter may include a material configured to absorb light in a wavelength of 550 to 580 nm and emit light in a wavelength of 580 to 620 nm.

A material of the second fluorescent filter may include a material configured to absorb light in a wavelength of 580 to 620 nm and emit light in a wavelength of 630 to 680 nm.

A material of the first fluorescent filter may include Alizarin Complexon, Alizarin Red, Astrazon Brilliant Red 4G, Astrazon Red 6B, Bodipy TR, Calcium Orange, Cy3.18, Di-8-ANEPPS, Ethidium bromide, Flazo Orange, FM1-43, Genacryl Brilliant Red B, Lissamine Rhodamine B200 (RD 200), LysoTracker Red, Magdala Red, Magnesium Orange, Mitotracker Orange CMTMRos, Mithramycin, Phosphine R, Pontochrome Blue Black, Procion Yellow, Propidium Iodide, R-phycoerythrin, Rhodamine B 200, Rhodamine B Extra, Rhodamine BB, Rhodamine BG, Rhodamine Green fluorophore, Rhodamine Red, Rose Bengal, Sevron Brilliant Red 2B, Sevron Brilliant Red 4G, Sevron Brilliant Red B, Thiazine Red R, X-Rhodamine, Xvlene Orange, or XRITC.

A material of the second fluorescent filter may include allophycocyanin, pararosaniline (Feulgen), SYTO 17 red fluorescent nucleic acid stain, Texas Red, TOTO 3, TO-PRO-3, Ultralite, YOYO-3, or YOYO-PRO-3.

An absorption wavelength of the first fluorescent filter may be different from that of the second fluorescent filter.

The optical unit may be applied as an optical unit of a display panel for a liquid crystal display (LCD) or an optical unit of a display panel for an organic light emitting diode (OLED) display.

A lower polarizer may be provided below the display panel for an LCD.

A compensation layer may be interposed between the display panel for an OLED and the polarizer.

An optical unit and a display device having the same according to the present disclosure can improve visibility of light of a laser pointer by forming upper and lower fluorescent filters on an external surface of a display device to solve a disadvantage in that visibility is reduced outside of an angle at which specular reflection occurs when light of the laser pointer is emitted toward a screen after a display is driven.

Particularly, in the present disclosure, since upper and lower fluorescent filters are stacked on a display panel such that a light emission wavelength of the lower fluorescent filter of a lower layer is absorbed by the upper fluorescent filter of an uppermost layer, visibility can be improved using the upper and lower fluorescent filters.

In addition, in the present disclosure, since light emission energy of a lower fluorescent filter which absorbs light in a display panel is absorbed by an upper fluorescent filter and reaches a high energy state, and more light is emitted by absorbing light of a laser pointer to emit more light, visibility of the light of the laser pointer can be improved.

It should to be understood that both the foregoing general description and the following detailed description are explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles.

FIG. 3 is a schematic view illustrating light absorption and emission states of upper and lower fluorescent filters of the LCD according to a first embodiment of the present disclosure.

DETAILED DESCRIPTION

Figure 1:
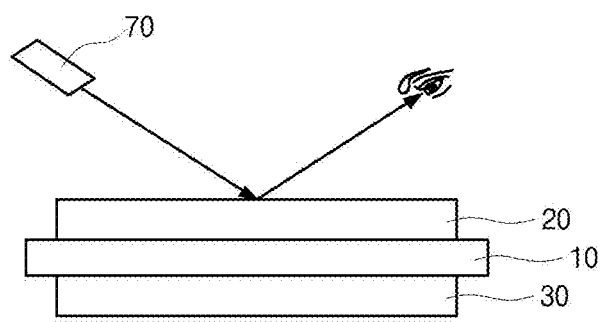
FIG. 1 is a schematic view illustrating a liquid crystal display (LCD) according to the related art.

Hereinafter, exemplary embodiments of the present disclosure will be described in detail with reference to the accompanying drawings such that those skilled in the art may easily perform the exemplary embodiments.

An example of the present disclosure will be described with a liquid crystal display (LCD), but is not limited thereto, and may also be applied to a luminescent type display device such as an electro luminescence (EL) display, a light emitting diode (LED) display, a vacuum fluorescent display (VFD), a field emission display (FED), and a plasma display panel (PDP), and a non-luminescent type display device.

In addition, advantages and features of the present disclosure and methods of achieving the same will be clearly understood with reference to the following detailed examples. However, the present disclosure is not limited to the examples to be disclosed below and may be implemented in various different forms. The examples are provided in order to fully explain the present disclosure and the scope of the present disclosure for those skilled in the art.

The scope of the present disclosure is defined by the appended claims. Like reference numerals designate like elements throughout.

Figure 2:
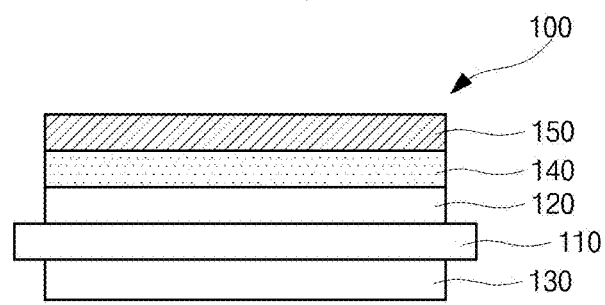
FIG. 2 is a schematic cross-sectional view illustrating an LCD according to a first embodiment of the present disclosure.

FIG. 2 is a schematic cross-sectional view illustrating an LCD according to a first embodiment of the present disclosure.

As illustrated in FIG. 2, an LCD 100 according to one embodiment of the present disclosure includes a liquid crystal panel 110 on which an image is displayed, an upper polarizer 120 disposed on the liquid crystal panel 110, a lower polarizer 130 disposed below the liquid crystal panel 110, a lower fluorescent filter 140 disposed on the upper polarizer 120, and an upper fluorescent filter 150 disposed on the lower fluorescent filter 140.

Here, although not illustrated in the drawing, each of the upper polarizer 120 and the lower polarizer 130 includes a polarizing layer (not shown) configured to polarize incident light, first and second transparent support layers (not shown) respectively disposed on and below the polarizing layer (not shown), and a pressure sensitive adhesive (not shown and referred to as PSA below) adhered to a portion below the second transparent support layer.

The polarizing layer (not shown) is generally formed by adsorbing halogen salt crystals, such as iodine, onto a polyvinyl alcohol (referred to as PVA below) film and elongating the PVA film in a specific direction such that iodine crystals are arranged in a direction parallel to the elongating direction.

The iodine crystals perform a polarizing function by absorbing light incident in a first direction and transmitting light incident in a second direction perpendicular to the first direction.

The first and second transparent support layers (not shown) are films configured to support and protect the polarizing layer (not shown), and a material thereof should be optically transparent, free from double refraction, and heat-resistant, and should have high mechanical strength sufficient to physically support and protect the polarizing layer (not shown).

In addition, the first and second transparent support layers (not shown) should have characteristics in which surfaces thereof are wide and may be reliably bonded to an adhesive or the PSA. For example, the material may be an acetate resin such as triacetyl cellulose (TAC), a polyether sulfone resin, a polycarbonate resin, a polyamide resin, a polyimide resin, a polyolefin resin, an acrylic resin, a polynorbornene resin, or the like.

In addition, in view of polarization properties or durability of the first and second transparent support layers (not shown), a TAC film having a surface thereof saponified with an alkali or the like is most preferably used therefor.

The PSA (not shown) is applied to attach the polarizer having the above-described configuration to a liquid crystal cell, and may be formed properly using an acrylic PSA, a silicone PSA, a polyester PSA, a polyurethane PSA, a polyether PSA, or a rubber PSA. Particularly, in view of preventing delamination or peeling due to moisture absorption, reducing chemical characteristics or preventing liquid crystal cell bending due to a difference in thermal expansion, and forming an LCD having high quality and superior durability, a PSA having a low moisture absorption rate and superior heat resistance is preferably used.

The above-described PSA may be formed through a method of forming a delaminated cord using a delaminating agent such as an acrylic delaminating agent, a silicone delaminating agent, an acrylic silicone delaminating agent, a polyester delaminating agent, a heat resistant rubber delaminating agent, a long chain acyl delaminating agent, a fluorine delaminating agent, or a molybdenum sulfide delaminating agent.

However, the upper polarizer 120 and the lower polarizer 130 are not limited to the above-described configuration including, for example, the polarizing layer, the first and second transparent support layers disposed on and below the polarizing layer, the PSA disposed on the portion below the second transparent support layer, and the polarizers may be formed by coupling various elements. In the present disclosure, one example of the above-described configuration has been described.

FIG. 3 is a schematic view illustrating light absorption and emission states of upper and lower fluorescent filters of the LCD according to a first embodiment of the present disclosure.

Figure 4:
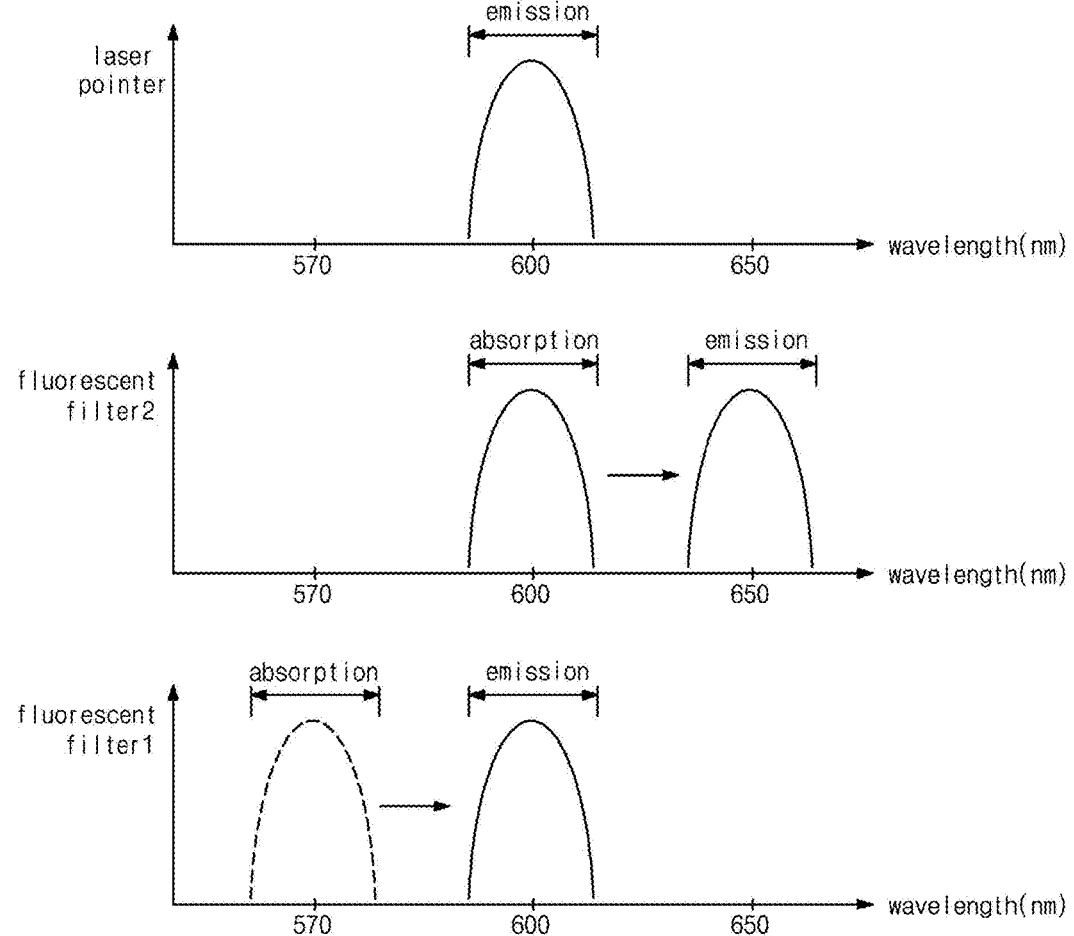
FIG. 4 is a schematic view illustrating wavelength bands of light absorbed and emitted by the upper and lower fluorescent filters of the LCD according to a first embodiment of the present disclosure.

FIG. 4 is a schematic view illustrating wavelength bands of light absorbed and emitted by the upper and lower fluorescent filters of the LCD according to a first embodiment of the present disclosure.

As illustrated in FIGS. 3 and 4, the lower fluorescent filter 140 and the upper fluorescent filter 150 constitute an optical unit.

The lower fluorescent filter 140 is located below the upper fluorescent filter 150 and serves to absorb light, which is incident from a portion below the liquid crystal panel 110, in a first wavelength band and emit light in a second wavelength band. Here, the lower fluorescent filter 140 serves as a support layer configured to transmit energy so that the upper fluorescent filter 150 may emit more light.

In addition, light in the first wavelength band may have a wavelength in the range of 550 to 580 nm, and light in the second wavelength band may have a wavelength in the range of 580 to 620 nm. However, the light in the first wavelength band and the light in the second wavelength band are not limited to the light in the above-described wavelength bands, and may vary according to a kind of light emitted from the display panel 110 and a laser pointer 170.

A material of the lower fluorescent filter 140 may include Alizarin Complexon, Alizarin Red, Astrazon Brilliant Red 4G, Astrazon Red 6B, Bodipy TR, Calcium Orange, Cy3.18, Di-8-ANEPPS, Ethidium bromide, Flazo Orange, FM1-43, Genacryl Brilliant Red B, Lissamine Rhodamine B200 (RD 200), LysoTracker Red, Magdala Red, Magnesium Orange, Mitotracker Orange CMTMRos, Mithramycin, Phosphine R, Pontochrome Blue Black, Procion Yellow, Propidium Iodide, R-phycoerythrin, Rhodamine B 200, Rhodamine B Extra, Rhodamine BB, Rhodamine BG, Rhodamine Green fluorophore, Rhodamine Red, Rose Bengal, Sevron Brilliant Red 2B, Sevron Brilliant Red 4G, Sevron Brilliant Red B, Thiazine Red R, X-Rhodamine, Xvlene Orange, or XRITC.

In addition, the upper fluorescent filter 150 absorbs optical energy in the second wavelength band received from the lower fluorescent filter 140 and optical energy in the second wavelength band received from the laser pointer 170, and emits strong light, that is, light in a third wavelength band.

Here, the light in the third wavelength band may have a wavelength in the range of 630 to 680 nm, but the light in the third wavelength band is also not limited to the light in the above-described wavelength band and may vary according to a kind of light emitted from the display panel 110 and the laser pointer 170.

In addition, an emission wavelength of the lower fluorescent filter 140 may match an absorption wavelength of the upper fluorescent filter 150.

In addition, the upper fluorescent filter 150 absorbs the light in the second wavelength band emitted from the lower fluorescent filter 140, maintains the light in an energy state which is easy to emit, then absorbs light in the second wavelength band from the laser pointer 170, and emits the light in the third wavelength band.

In addition, the upper fluorescent filter 150 is located at an outermost side from the upper polarizer 120, absorbs and excites the light in the second wavelength band emitted from the laser pointer 170, and emits the light in the second wavelength band while the light falls to a ground state.

That is, the upper fluorescent filter 150 serves to absorb the light in the second wavelength band and emit light in the first wavelength band as the light in the third wavelength band which is greater than the second wavelength band. Here, the absorption wavelength of the upper fluorescent filter 150 may match or be similar to the emission wavelength of the laser pointer 170.

In addition, a material of the upper fluorescent filter 150 may include allophycocyanin, pararosaniline (Feulgen), SYTO 17 red fluorescent nucleic acid stain, Texas Red, TOTO 3, TO-PRO-3, Ultralite, YOYO-3, and YOYO-PRO-3.

Accordingly, a color may be controlled by changing an optical spectrum of incident light by applying fluorescence to light having a wavelength of 400 nm or less which has high energy or light having a long wavelength which has low energy, that is the light in the second wavelength band, among the incident light incident on the upper polarizer 120 from the laser pointer 170.

Particularly, in the present disclosure, a distortion of a driving color may be minimized using two fluorescent filters to prevent the occurrence of a distortion of the driving color in a case in which one fluorescent film is used.

That is, the distortion of the driving color may be minimized to some extent by controlling a color temperature of a light source or changing a backlight source or a color value of the polarizer.

That is, in a case in which white light is emitted from a display device and two fluorescent filters are used, the white light is converted into red light, and, here, a color of the polarizer is changed to a blue color by controlling an amount of iodine in the polarizing layer of the polarizer such that white light is finally emitted, and thus the distortion of the driving color may be minimized to some extent.

In addition, in a case in which blue light is emitted from a light source and two fluorescent filters are used, red light appears and the blue light is finally changed into white light, and thus a distortion of driving color may be minimized.

As described above, the LCD 100 according to one embodiment of the present disclosure can improve visibility of light of the laser pointer by forming the upper and lower fluorescent filters 150 and 140 on the external surface of the LCD 100 to solve a disadvantage in that visibility is reduced outside of an angle at which specular reflection occurs when the light of the laser pointer is emitted toward a screen after a display is driven.

Particularly, the present disclosure may improve visibility of light of a laser pointer in a display driving screen in all directions by placing upper and lower fluorescent filters on an upper polarizer.

Figure 5:
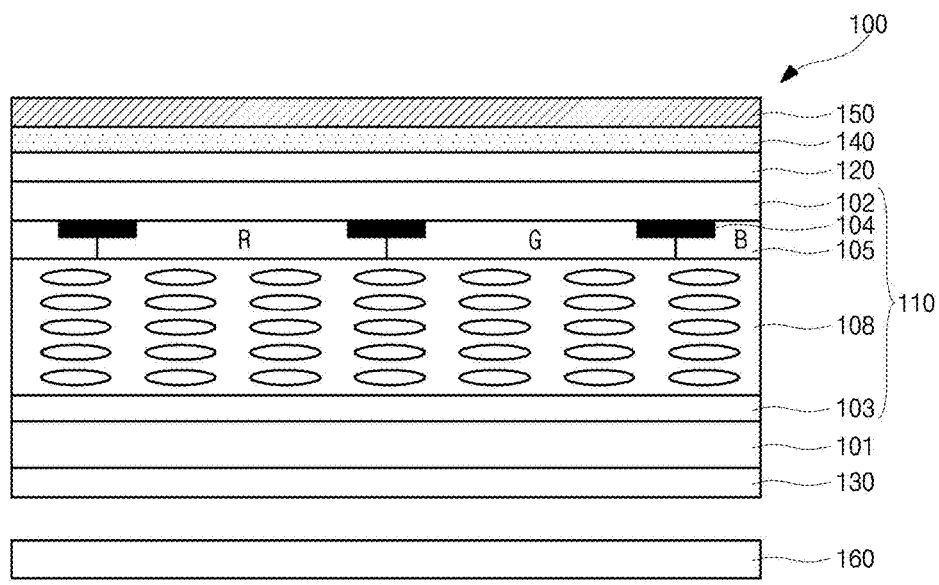
FIG. 5 is a schematic cross-sectional view illustrating the LCD according to a first embodiment of the present disclosure.

FIG. 5 is a schematic cross-sectional view illustrating the LCD according to a first embodiment of the present disclosure.

As illustrated in FIG. 5, the LCD 100 according to one embodiment of the present disclosure includes the liquid crystal panel 110 on which an image is displayed, the upper polarizer 120 disposed on the liquid crystal panel 110, the lower polarizer 130 disposed below the liquid crystal panel 110, the lower fluorescent filter 140 disposed on the upper polarizer 120, the upper fluorescent filter 150 disposed on the lower fluorescent filter 140, and a backlight unit 160 disposed below the lower polarizer 130 and configured to supply light to the liquid crystal panel 110.

Here, the liquid crystal panel 110 includes an array substrate 101, a color filter substrate 102 facing the array substrate 101 and a liquid crystal layer 108 between the two substrates 101 and 102.

The array substrate 101 may include a first substrate (not shown), a thin film transistor array 103 including a plurality of thin film transistors (not shown) formed on the first substrate in a matrix form, and the like.

The color filter substrate 102 include a second substrate (not shown), red, green, and blue color filters 105 formed on the second substrate (not shown), and a black matrix 104 formed between the color filters 105 and configured to divide regions of the color filters 105 and prevent a light leakage phenomenon.

Referring to FIG. 5, the lower fluorescent filter 140 is located below the upper fluorescent filter 150 and serves to absorb light, which is incident from a portion below the liquid crystal panel 110, in the first wavelength band and emit light in the second wavelength band. Here, the lower fluorescent filter 140 serves as a support layer configured to transmit energy so that the upper fluorescent filter 150 may emit more light.

In addition, the light in the first wavelength band may have a wavelength in the range of 550 to 580 nm, and the light in the second wavelength band may have a wavelength in the range of 580 to 620 nm. However, the light in the first wavelength band and the light in the second wavelength band are not limited to the light in the above-described wavelength bands and may vary according to a kind of light emitted from the display panel 110 and a laser pointer (not shown in FIG. 5, see 170 of FIG. 7).

The material of the lower fluorescent filter 140 may include Alizarin Complexone, Alizarin Red, Astrazon Brilliant Red 4G, Astrazon Red 6B, Bodipy TR, Calcium Orange, Cy3.18, Di-8-ANEPPS, Ethidium bromide, Flazo Orange, FM1-43, Genacryl Brilliant Red B, Lissamine Rhodamine B200 (RD 200), LysoTracker Red, Magdala Red, Magnesium Orange, Mitotracker Orange CMTMRos, Mithramycin, Phosphine R, Pontochrome Blue Black, Procion Yellow, Propidium Iodide, R-phycoerythrin, Rhodamine B 200, Rhodamine B Extra, Rhodamine BB, Rhodamine BG, Rhodamine Green fluorophore, Rhodamine Red, Rose Bengal, Sevron Brilliant Red 2B, Sevron Brilliant Red 4G, Sevron Brilliant Red B, Thiazine Red R, X-Rhodamine, Xvlene Orange, or XRITC.

In addition, the upper fluorescent filter 150 absorbs optical energy in the second wavelength band received from the lower fluorescent filter 140 and optical energy in the second wavelength band received from the laser pointer 170, and emits strong light, that is, light in the third wavelength band.

Figure 7:
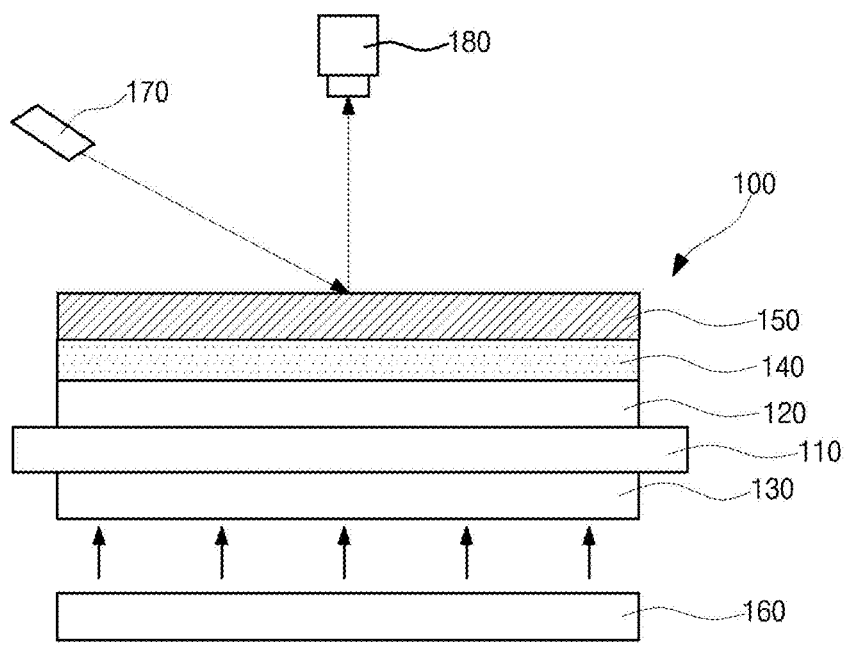
FIG. 7 is a schematic cross-sectional view illustrating the LCD according to a first embodiment of the present disclosure when light of a laser pointer is emitted.

Here, the light in the third wavelength band may have a wavelength in the range of 630 to 680 nm, but the light in the third wavelength band is not limited to the light in the above-described wavelength band and may vary according to a kind of light emitted from the display panel 110 and the laser pointer (not shown, see 170 of FIG. 7).

In addition, the upper fluorescent filter 150 absorbs light in the second wavelength band emitted from the lower fluorescent filter 140, maintains the light in an energy state which is easy to emit, then absorbs light in the second wavelength band from the laser pointer 170, and emits the light in the third wavelength band.

In addition, the upper fluorescent filter 150 is located at an outermost side from the upper polarizer 120, absorbs and excites the light in the second wavelength band emitted from the laser pointer 170, and emits the light in the second wavelength band while the light falls to the ground state.

That is, the upper fluorescent filter 150 serves to absorb the light in the second wavelength band and emit the light in the first wavelength band as the light in the third wavelength band which is greater than the second wavelength band.

In addition, the material of the upper fluorescent filter 150 may include allophycocyanin, pararosaniline (Feulgen), SYTO 17 red fluorescent nucleic acid stain, Texas Red, TOTO 3, TO-PRO-3, Ultralite, YOYO-3, or YOYO-PRO-3.

Figure 6:
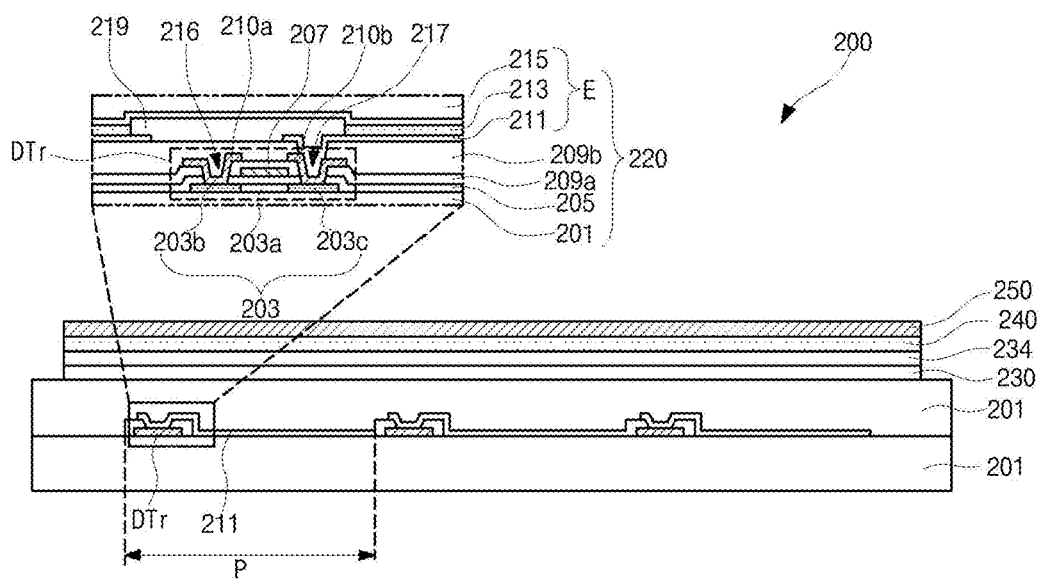
FIG. 6 is a schematic cross-sectional view illustrating an organic light emitting diode (OLED) display according to a second embodiment of the present disclosure.

FIG. 6 is a schematic cross-sectional view illustrating an organic light emitting diode (OLED) display according to a second embodiment of the present disclosure.

An OLED display 200 according to another embodiment of the present disclosure is classified into a top emission type OLED display and a bottom emission type OLED display according to a transmission direction of emitted light, and hereinafter, the top emission type OLED display will be described as one example of the present disclosure.

As illustrated in FIG. 6, the OLED display 200 according to one embodiment of the present disclosure includes an organic light emitting panel 220 on which an image is displayed, a compensation layer 230 disposed on the organic light emitting panel 220, a polarizer 234, a lower fluorescent filter 240 disposed on the polarizer 234, and an upper fluorescent filter 250 disposed on the lower fluorescent filter 240.

In addition, in the OLED display 200, a substrate 201 on which driving thin film transistors DTr and LEDs E are formed is encapsulated by a protective film 202.

More specifically, a semiconductor layer 203 is formed in a pixel region P on the substrate 201, and the semiconductor layer 203 is formed of silicon and includes an active region 203a forming a channel in a central portion thereof, and source and drain regions 203b and 203c doped with a high impurity concentration on both side surfaces of the active region 203a.

A gate insulating layer 205 is formed on the semiconductor layer 203, and a gate electrode 207 corresponding to the active region 203a of the semiconductor layer 203 and a gate line, which is not illustrated in the drawing, extending in one direction are formed on the gate insulating layer 205.

In addition, a first insulating interlayer 209a is formed on an entire surface of the gate electrode 207 and the gate line (not shown), and here, the first insulating interlayer 209a and the gate insulating layer 205 disposed below the first insulating interlayer 209a include first and second semiconductor layer contact holes 216 configured to expose source and drain regions 203b and 203c located at both of the side surfaces of the active region 203a.

Source and drain electrodes 210a and 210b spaced apart from each other and respectively configured to be in contact with the source and drain regions 203b and 203c exposed through the first and second semiconductor layer contact holes 216 are formed on the first insulating interlayer 209a including the first and second semiconductor layer contact holes 216.

In addition, a second insulating interlayer 209b including a drain contact hole 217 configured to expose the drain electrode 210b is formed on the first insulating interlayer 209a exposed between the source and drain electrodes 210a and 210b and the two electrodes 210a and 210b. Here, the source and drain electrodes 210a and 210b, the semiconductor layer 203 including the source and drain regions 203b and 203c configured to be in contact with the electrodes 210a and 210b, the gate insulating layer 205 formed on the semiconductor layer 203, and the gate electrode 207 constitute the driving thin film transistor DTr.

Meanwhile, although not illustrated in the drawings, a data line (not shown) which intersects the gate line (not shown) and defines the pixel region P is formed. In addition, a switching thin film transistor (not shown) having the same structure as the driving thin film transistor DTr is connected to the driving thin film transistor DTr.

In addition, a top gate type transistor including the semiconductor layer 203 having a polysilicon semiconductor layer is illustrated as examples of the switching thin film transistor (not shown) and the driving thin film transistor DTr, but a bottom gate type transistor formed of pure or impure amorphous silicon may also be formed as modified examples thereof.

In addition, a first electrode 211, which is connected to the drain electrode 210b of the driving thin film transistor DTr and constitutes an anode as one element forming the LED E using, for example, a material having a relatively high work function value, is formed on the second insulating interlayer 209b in a region in which an image is substantially displayed.

The first electrode 211 is formed at each of the pixel regions P, and banks 219 are formed between the first electrodes 211 formed in the pixel regions P. That is, the banks 219 serve as boundaries between the pixel regions P, and thus the first electrodes 211 are divided by the pixel regions P.

In addition, an organic light emitting layer 213 is formed on the first electrode 211. The organic light emitting layer 213 may be formed as a single layer formed of a light emitting material, and may also be formed as a multilayer including a hole injection layer, a hole transport layer, an emitting material layer, an electron transport layer, and an electron injection layer to increase a light emission efficiency.

The organic light emitting layer 213 expresses a red color R, a green color G, and a blue color B, and generally separate organic materials (not shown) configured to express the red color R, the green color G, and the blue color B are patterned and used in each of the pixel regions P.

In addition, a second electrode 215 constituting a cathode is formed on an entire surface of the organic light emitting layer 213. Here, the second electrode 215 has a double layer structure and includes a semitransparent metal film on which a metal material having a low work function is thinly deposited. In addition, the second electrode may also have a double layer structure in which a transparent conductive material is thickly deposited on a semitransparent metal film.

Accordingly, the OLED display 200 according to one embodiment of the present disclosure is driven as the top emission type OLED display in which light emitted from the organic light emitting layer 213 is emitted toward the second electrode 215.

In the OLED display 200, when predetermined voltages are applied to the first electrode 211 and the second electrode 215 according to a selected color signal, holes injected from the first electrode 211 and electrons supplied from the second electrode 215 are transported to the organic light emitting layer 213 and excitons are generated, and when the excitons transition from an excited state to the ground state, light is generated and emitted as visible light.

Here, since the emitted light passes through the transparent second electrode 215 and exits to the outside, the OLED display 200 displays any image.

In addition, the protective film 202 in a thin film type is formed on the driving thin film transistor DTr and the LED E, and the OLED display 200 according to another embodiment of the present disclosure is encapsulated by the protective film 202. Here, it is preferable for the protective film 202 to be used by organic and inorganic protective films being alternately stacked to prevent penetration of moisture into the OLED display 200.

In addition, in the OLED display 200 of the present disclosure, the compensation layer 230 is formed on the protective film 202 formed in a direction of light transmission to prevent reduction of contrast due to external light. Here, in a process in which external light is reflected and exits from the substrate of the OLED, the compensation layer 230 functions to change a phase difference of light such that the reflected light is absorbed by a polarizer. In addition, the compensation layer 230 may be defined as a quarter wave plate (QWP), a half wave plate (HWP), or a retardation layer, that is, a phase delay plate.

That is, the compensation layer 230 may also function to prevent reflection by absorbing light incident from the outside and reflected by the substrate of the OLED.

In addition, the compensation layer 230 may use the QWP, a reverse wave dispersion-QWP (r-QWP), a Posi-C plate+QWP, a Posi-C plate+r-QWP, or a QWP+HWP.

Here, although not illustrated in the drawing, the polarizer 234 includes a polarizing layer (not shown) configured to polarize incident light, first and second transparent support layers (not shown) disposed on and below the polarizing layer (not shown), and a PSA (not shown) attached to a portion below the second transparent support layer (not shown).

The polarizing layer (not shown) is generally formed by adsorbing halogen salt crystals such as iodine on a PVA film and elongating the PVA film in a specific direction such that iodine crystals are arranged in a direction parallel to the elongating direction.

The iodine crystal performs a polarizing function by absorbing light incident in the first direction and transmitting light incident in the second direction perpendicular to the first direction.

The first and second transparent support layers (not shown) are films to support and protect the polarizing layer (not shown), and a material thereof should be optically transparent, free from double refraction, and heat-resistant, and should have high mechanical strength sufficient to physically support and protect the polarizing layer (not shown).

In addition, the first and second transparent support layers (not shown) should have characteristics in which surfaces thereof are wide and may be reliably bonded to an adhesive or a PSA. For example, the material may be an acetate resin such as TAC, a polyether sulfone resin, a polycarbonate resin, a polyamide resin, a polyimide resin, a polyolefin resin, an acrylic resin, a polynorbornene resin, or the like.

In addition, in view of polarization characteristics or durability, a TAC film having a surface thereof saponified with an alkali or the like is most preferably used for the first and second transparent support layers (not shown).

The PSA (not shown) is applied to attach the polarizer having the above-described configuration to a liquid crystal cell, and may be formed properly using an acrylic PSA, a silicone PSA, a polyester PSA, a polyurethane PSA, a polyether PSA, or a rubber PSA. Particularly, in view of preventing delaminating or peeling due to moisture absorption, reducing chemical characteristics due to a difference in thermal expansion, preventing liquid crystal cell bending, and forming an LCD having high quality and superior durability, a PSA having a low moisture absorption rate and superior heat resistance is preferably used.

The above-described PSA may be formed through a method of forming a delaminated cord using a delaminating agent such as an acrylic delaminating agent, a silicone delaminating agent, an acrylic silicone delaminating agent, a polyester delaminating agent, a heat resistant rubber delaminating agent, a long chain acyl delaminating agent, a fluorine delaminating agent, or a molybdenum sulfide delaminating agent.

However, the polarizer 234 is not limited to the above-described configuration including, for example, the polarizing layer, the first and second transparent support layers disposed on and below the polarizing layer, the PSA disposed below the second transparent support layer, and the polarizer may be formed by coupling various elements. In the present disclosure, one example of the above-described configuration has been described.

Meanwhile, the lower fluorescent filter 240 is located below the upper fluorescent filter 250 and serves to absorb light in the first wavelength band that is incident from a portion below the organic light emitting panel 220 and emit light in the second wavelength band. Here, the lower fluorescent filter 240 serves as a support layer configured to transmit energy to the upper fluorescent filter 250 so that the upper fluorescent filter 250 may emit more light.

In addition, the light in the first wavelength band may have a wavelength in the range of 550 to 580 nm, and the light in the second wavelength band may have a wavelength in the range of 580 to 620 nm. However, the light in the first wavelength band and the light in the second wavelength band are not limited to the light in the above-described wavelength bands, and may vary according to a kind of light emitted from the organic light emitting panel 220 and a laser pointer (not shown in FIG. 6, see 170 of FIG. 7).

A material of the lower fluorescent filter 140 may include Alizarin Complexon, Alizarin Red, Astrazon Brilliant Red 4G, Astrazon Red 6B, Bodipy TR, Calcium Orange, Cy3.18, Di-8-ANEPPS, Ethidium bromide, Flazo Orange, FM1-43, Genacryl Brilliant Red B, Lissamine Rhodamine B200 (RD 200), LysoTracker Red, Magdala Red, Magnesium Orange, Mitotracker Orange CMTMRos, Mithramycin, Phosphine R, Pontochrome Blue Black, Procion Yellow, Propidium Iodide, R-phycoerythrin, Rhodamine B 200, Rhodamine B Extra, Rhodamine BB, Rhodamine BG, Rhodamine Green fluorophore, Rhodamine Red, Rose Bengal, Sevron Brilliant Red 2B, Sevron Brilliant Red 4G, Sevron Brilliant Red B, Thiazine Red R, X-Rhodamine, Xvlene Orange, or XRITC.

In addition, the upper fluorescent filter 250 absorbs optical energy in the second wavelength band received from the lower fluorescent filter 240 and optical energy in the second wavelength band received from the laser pointer 170, and emits strong light, that is, light in the third wavelength band.

Here, the light in the third wavelength band may have a wavelength in the range of 630 to 680 nm, but the light in the third wavelength band is not limited to the light in the above-described wavelength band and may vary according to a kind of light emitted from the organic light emitting panel 220 and the laser pointer (not shown in FIG. 6, see 170 of FIG. 7).

In addition, the upper fluorescent filter 250 absorbs the light in the second wavelength band emitted from the lower fluorescent filter 240, maintains the light in an energy state which is easy to emit, then absorbs light in the second wavelength band from the laser pointer 170, and emits the light in the third wavelength band.

In addition, the upper fluorescent filter 250 is located at an outermost side from the upper polarizer 234, absorbs and excites the light in the second wavelength band emitted from the laser pointer 170, and emits the light in the second wavelength band while the light falls to the ground state.

That is, the upper fluorescent filter 250 serves to absorb the light in the second wavelength band and emit the light in the first wavelength band as the light in the third wavelength band which is greater than the second wavelength band.

In addition, a material of the upper fluorescent filter 150 may include allophycocyanin, pararosaniline (Feulgen), SYTO 17 red fluorescent nucleic acid stain, Texas Red, TOTO 3, TO-PRO-3, Ultralite, YOYO-3, and YOYO-PRO-3.

FIG. 7 is a schematic cross-sectional view illustrating the LCD according to a first embodiment of the present disclosure when light is emitted by a laser pointer.

Referring to FIG. 7, when light of the laser pointer 170 is emitted toward the LCD 100 according to one embodiment of the present disclosure, brightness of an image portion toward which the light is emitted is measured by a luminance meter 180.

Here, light in the first wavelength band emitted from the backlight unit 160 passes through the lower polarizer 130, the liquid crystal panel 110, and the upper polarizer 120, and is absorbed by the lower fluorescent filter 140.

In addition, the light in the first wavelength band absorbed by the lower fluorescent filter 140 is excited and converted into light in the second wavelength band higher than the first wavelength band, and is emitted toward the upper fluorescent filter 150. Here, the light in the first wavelength band may have a wavelength in the range of 550 to 580 nm, and the light in the second wavelength band may have a wavelength in the range of 580 to 620 nm. However, the light in the first wavelength band and the light in the second wavelength band are not limited to the light in the above-described wavelength bands, and may vary according to a kind of light emitted from the display panel 110 and the laser pointer 170.

Next, the upper fluorescent filter 150 absorbs the light in the second wavelength band reemitted from the lower fluorescent filter 140, and the absorbed light in the second wavelength band is excited to be converted into and emitted as light in the third wavelength band, that is, the light in the second wavelength band.

Here, the light in the third wavelength band may have a wavelength in the range of 630 to 680 nm, but is not limited to the light in the above-described third wavelength band and may vary according to a kind of light emitted from the display panel 110 and the laser pointer 170.

Figure 8:
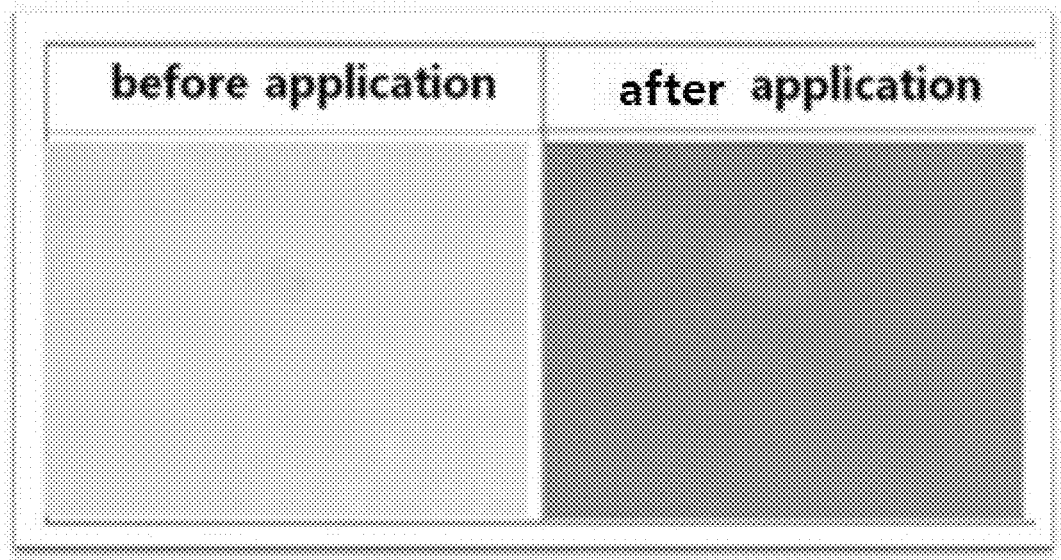
FIG. 8 is a view illustrating an image seen on the LCD according to a first embodiment of the present disclosure when light of the laser pointer is emitted toward the LCD.

FIG. 8 is a view illustrating an image seen on the LCD according to a first embodiment of the present disclosure when light of the laser pointer is emitted toward the LCD.

As illustrated in FIG. 8, in a case in which the lower and upper fluorescent filters 140 and 150 are not applied to the LCD 100, when light of the laser pointer is emitted, an image portion toward which the light is emitted is blurrily displayed.

However, in the case in which the lower and upper fluorescent filters 140 and 150 are applied to the LCD 100 as described in the present disclosure, when light of the laser pointer is emitted, an image portion toward which the light is emitted is clearly displayed.

Figure 9:
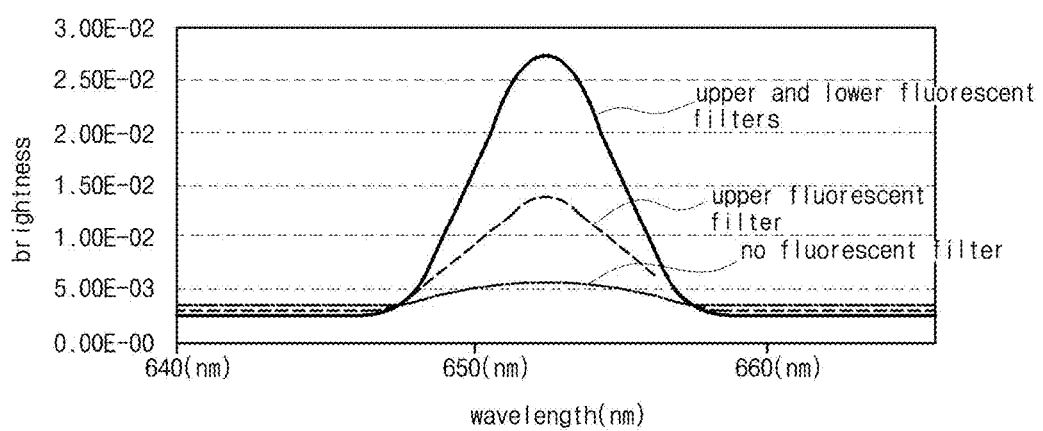
FIG. 9 is a schematic view illustrating a brightness distribution of an image seen on the LCD according to a first embodiment of the present disclosure when light of the laser pointer is emitted toward the LCD.

FIG. 9 is a schematic view illustrating a brightness distribution of an image seen on the LCD according to a first embodiment of the present disclosure when light of the laser pointer is emitted toward the LCD.

As illustrated in FIG. 9, in the case in which the lower and upper fluorescent filters 140 and 150 are not applied to the LCD 100, when light of the laser pointer is emitted, it can be seen that brightness of an image portion toward which the light is emitted is hardly different from brightness of a portion toward which the light is not emitted. Here, it can be seen that the brightness of the image portion is about 5.00*E−03.

In addition, as illustrated in FIG. 9, in a case in which only the upper fluorescent filter 150 is applied to the LCD 100, it can be seen that brightness of an image portion is slightly greater than brightness of a portion toward which light is not emitted. Here, it can be seen that the brightness of the image portion is about 1.35*E−02.

In addition, as illustrated in FIG. 9, in the case in which the lower and upper fluorescent filters 140 and 150 are applied to the LCD 100, it can be seen that brightness of an image portion is slightly greater than brightness of a portion toward which light is not emitted. Here, it can be seen that the brightness of the image portion is about 2.80*E−2.

Accordingly, when the lower and upper fluorescent filters 140 and 150 are applied to the LCD 100 like the present disclosure and light of the laser pointer is emitted, it can be seen that an image portion toward which the light is emitted is clearly displayed.

Consequently, an optical unit and a display device having the same can improve visibility of light of a laser pointer by forming upper and lower fluorescent filters on an external surface of an LCD to solve a disadvantage in that visibility is reduced outside of an angle at which specular reflection occurs when the light of the laser pointer is emitted toward a screen after a display is driven.

Particularly, in the present disclosure, since upper and lower fluorescent filters are stacked on a display panel such that a light emission wavelength of the lower fluorescent filter in a lower layer is absorbed by the upper fluorescent filter of an uppermost layer, visibility can be improved by using the upper and lower fluorescent filters.

In addition, in the present disclosure, since light emission energy of a lower fluorescent filter which absorbs light of a display panel is absorbed by an upper fluorescent filter and reaches a high energy state and more light is emitted by absorbing light of a laser pointer, visibility of the light of the laser pointer can be improved.

It should be understood by those skilled in the art that the disclosure may be performed in other concrete forms without changing the technological scope and essential features thereof.

It will be apparent to those skilled in the art that various modifications and variations can be made in the optical unit and the display device having the same of the present disclosure without departing from the technical idea or scope of the disclosure. Thus, it is intended that the present disclosure cover the modifications and variations of this disclosure provided they come within the scope of the appended claims and their equivalents.

What is claimed is:
1. An optical unit disposed on a polarizer, comprising:
a first fluorescent filter disposed on the polarizer; and
a second fluorescent filter disposed on the first fluorescent filter.

2. The optical unit of claim 1, wherein the first fluorescent filter absorbs light in a first wavelength band and converts the light into light in a second wavelength band.

3. The optical unit of claim 2, wherein:
light in the first wavelength band has a wavelength in a range of 550 to 580 nm; and
light in a second wavelength band has a wavelength in a range of 580 to 620 nm.

4. The optical unit of claim 1, wherein the second fluorescent filter absorbs light in a second wavelength band emitted from the first fluorescent filter, converts the light into light in a third wavelength band, and emits the light in the third wavelength band.

5. The optical unit of claim 4, wherein light in the third wavelength band has a wavelength in a range of 630 to 680 nm.

6. The optical unit of claim 1, wherein the second fluorescent filter absorbs light in a second wavelength band emitted from a laser pointer, converts the light into light in a third wavelength band, and emits the light in the third wavelength band.

7. The optical unit of claim 1, wherein an emission wavelength of the first fluorescent filter matches an absorption wavelength of the second fluorescent filter.

8. The optical unit of claim 1, wherein a material of the first fluorescent filter includes a material configured to absorb light in a wavelength of 550 to 580 nm and emit light in a wavelength of 580 to 620 nm.

9. The optical unit of claim 1, wherein a material of the second fluorescent filter includes a material configured to absorb light in a wavelength of 580 to 620 nm and emit light in a wavelength of 630 to 680 nm.

10. The optical unit of claim 1, wherein a material of the first fluorescent filter includes one of Alizarin Complexone, Alizarin Red, Astrazon Brilliant Red 4G, Astrazon Red 6B, Bodipy TR, Calcium Orange, Cy3.18, Di-8-ANEPPS, Ethidium bromide, Flazo Orange, FM1-43, Genacryl Brilliant Red B, Lissamine Rhodamine B200 (RD 200), LysoTracker Red, Magdala Red, Magnesium Orange, Mitotracker Orange CMTMRos, Mithramycin, Phosphine R, Pontochrome Blue Black, Procion Yellow, Propidium Iodide, R-phycoerythrin, Rhodamine B 200, Rhodamine B Extra, Rhodamine BB, Rhodamine BG, Rhodamine Green fluorophore, Rhodamine Red, Rose Bengal, Sevron Brilliant Red 2B, Sevron Brilliant Red 4G, Sevron Brilliant Red B, Thiazine Red R, X-Rhodamine, Xvlene Orange and XRITC.

11. The optical unit of claim 1, wherein a material of the second fluorescent filter includes one of allophycocyanin, pararosaniline (Feulgen), SYTO 17 red fluorescent nucleic acid stain, Texas Red, TOTO 3, TO-PRO-3, Ultralite, YOYO-3 and YOYO-PRO-3.

12. The optical unit of claim 1, wherein an absorption wavelength of the first fluorescent filter is different from that of the second fluorescent filter.

13. A display device comprising the optical unit of claim 1, wherein the optical unit includes an optical unit of a display panel for a liquid crystal display (LCD) or an optical unit of a display panel for an organic light emitting diode (OLED) display.

14. The display device of claim 13, wherein a lower polarizer is provided below the display panel for an LCD.

15. The display device of claim 13, further comprising a compensation layer interposed between the display panel for an OLED display and the polarizer.

16. The display device of claim 13, wherein a backlight unit is provided below the display panel for an LCD.

* * * * *